United States Patent [19]

Watkinson

[11] Patent Number: 4,481,672
[45] Date of Patent: Nov. 6, 1984

[54] POLAR LOOP TRANSMITTER

[75] Inventor: Stephen W. Watkinson, Cambridge, England

[73] Assignee: U.S. Philips Corporation, New York, N.Y.

[21] Appl. No.: 468,212

[22] Filed: Feb. 22, 1983

[30] Foreign Application Priority Data

Mar. 26, 1982 [GB] United Kingdom ................. 8208912

[51] Int. Cl.³ ........................................... H04B 1/04
[52] U.S. Cl. .................................. 455/108; 332/37 D; 455/126
[58] Field of Search ....................... 455/108, 116, 126; 332/37 D, 38; 330/259, 260

[56] References Cited

U.S. PATENT DOCUMENTS

| 3,200,336 | 8/1965 | Valakos | 455/126 |
| 3,434,069 | 3/1969 | Jones | 330/259 |
| 3,486,128 | 12/1969 | Lohrmann | 455/126 |
| 3,662,290 | 5/1972 | Elliott | 455/126 |
| 3,891,926 | 6/1975 | Ishman et al. | 455/126 |
| 4,237,555 | 12/1980 | Dishal | 455/126 |

Primary Examiner—Marc E. Bookbinder
Attorney, Agent, or Firm—Joseph P. Abate

[57] ABSTRACT

A polar loop transmitter in which a negative feedback bias adjusting system is provided to control the bias voltage applied to a differential amplifier which supplies the input envelope information to an amplitude modulator, so that the R.F. modulated output goes to zero for a zero in the input.

The envelope information negative feedback bias adjusting system modifies a predetermined bias voltage supplied by a potentiometer by sampling and holding the peak value of negative spikes occurring in the output of the differential amplifier and using the held value as a negative feedback voltage to the differential amplifier.

11 Claims, 9 Drawing Figures

POLAR LOOP TRANSMITTER

FIELD OF THE INVENTION

The present invention relates to polar loop transmitters which have particular, but not exclusive, application in a VHF single-sideband (SSB) radio system.

DESCRIPTION OF THE PRIOR ART

For single-sideband transmissions with an audio bandwidth of typically 300 Hz to 3.3 kHz, it has been proposed to use channels spaced at 5 kHz, thus leaving approximately 1.5 kHz as a guard band. Of particular importance in such a narrow channel system is the level of spurious, out-of-channel, transmitter, emissions. In a conventional SSB transmitter the majority of adjacent channel interference is caused by intermodulation products produced by non-linearities in the power amplifier which is provided to reproduce a low level input signal at a high level. As linear power amplifiers are very difficult to implement at R. F. frequencies then it is preferred not to use them.

The polar loop principle is well known and has been proposed by Petrovic, V. and Gosling, W., "A Radically New Approach to SSB Transmitter Design", I.E.E. Conference on Radio Transmitters and Modulation Techniques, March 1980, No. 1980/40 page 110, as a means of producing very clean signals at high power levels. In a polar loop transmitter, an audio input signal is mixed with a local oscillator signal in a balanced mixer and either the upper or lower sideband is selected using a sideband filter. The selected sideband signal is resolved into polar components (phase and amplitude) by a first limiter and a first product detector.

A voltage controlled oscillator is provided to generate a signal at the transmitter output frequency. This signal is buffered and fed to an amplitude modulator whose output is fed to an R. F. power amplifier and then to a load, for example an antenna, via a low-pass filter.

An important feature of a polar loop transmitter is that it compares the high level output with the low level input to see if there are any errors and if there are, the errors can be used to effect corrections in the amplitude modulator. In order to carry out this comparison, the signal from the low-pass filter is sampled and mixed down to the pilot frequency of the selected sideband. This mixed down signal is resolved in polar components (phase and amplitude) by a second limiter and a second product detector. The phase signals from the first and second limiters are compared in a phase sensitive detector and the amplified and filtered output of the phase sensitive detector is applied to the voltage controlled oscillator to lock its phase to that of the input signal.

The signal envelope or amplitude signals from the first and second product detectors are applied to a differential amplifier which produces a control input voltage which amplitude modulates the R. F. carrier from the voltage controlled oscillator. The setting of the D. C. component of the control input voltage is critical because unless it is correct then the low power signal will not be copied accurately at high power. It has been proposed to set-up polar loop transmitters and the D. C. components of the control input voltage using a spectrum analyser. The disadvantage of this proposal is that it is impractical for use with mobile and portable SSB equipment as it would mean every service center, large and small, having a spectrum analyser and trained staff to use it. Furthermore, the effects of temperature variation and component aging will cause variations in this D. C. component voltage.

SUMMARY OF THE INVENTION

An object of the present invention is to be able to set-up conveniently a polar loop transmitter and to maintain this setting.

According to the present invention there is provided a polar loop transmitter including an amplitude modulator for modulating an input signal onto a carrier wave, a differential amplifier for supplying a signal to be modulated to the amplitude modulator, the differential amplifier having a first input to which is applied the envelope information of the input signal, a second input to which is applied the envelope information of the transmitter output signal, an output coupled to the amplitude modulator and a bias control voltage input, and a negative feedback bias adjusting system for varying the bias control voltage, connected between the output and bias control voltage input of the differential amplifier.

By providing the negative feedback bias adjusting system in the transmitter in accordance with the present invention, the control input voltage to the amplitude-modulator can be arranged such that the modulated output signal will be reduced to at least −70 dB with respect to peak envelope power whenever the input signal goes to zero thus ensuring that the high level output signal is a good copy of the input signal.

In an embodiment of the present invention, an R. F. power amplifier is coupled to an output of the amplitude modulator. A transfer characteristic of the control input voltage to the amplitude modulator plotted against the modulated R. F. output from the power amplifier exhibits an abrupt discontinuity. The negative feedback bias adjusting system is arranged to adjust the bias voltage so that for a zero in the input signal, the control input voltage corresponds closely to said abrupt discontinuity.

The negative feedback bias adjusting system may comprise means for supplying a predetermined bias voltage and means for supplying a variable bias voltage dependent upon negative input peaks taking the output of the differential amplifier below the abrupt discontinuity in said transfer characteristic.

The variable bias voltage supplying means may comprise a peak hold circuit for sampling and holding the value of negative spikes produced by the negative input peaks and applying the value held as the variable bias voltage.

Since the effectiveness of the negative feedback bias-adjusting system is dependent on the loop gain, an A. C. amplifier may be provided to amplify the negative spikes before their peak level is detected and stored. An advantage of using an A. C. amplifier over a D. C. amplifier is that there are no problems of D. C. drift with temperature variations.

Ideally the adjustment of the bias voltage should only take place when there are zero crossings in the input signal and to this end the transmitter in accordance with the present invention may comprise means for permitting the bias voltage to be adjusted only when zero crossings occur in the input signal. Said means may inhibit the connection of the variable bias voltage supplying means to the bias control voltage input if the time elapse between successive zero crossings exceeds a predetermined period of time. When the connection of the variable bias voltage supplying means is inhibited, the predetermined bias voltage is applied to the bias control input of the differential amplifier thus ensuring for example that the pilot carrier is radiated at the correct level.

BRIEF DESCRIPTION OF THE DRAWINGS

The present invention will now be described, by way of example, with reference to the accompanying drawings, wherein.

DESCRIPTION OF THE PREFERRED EMBODIMENTS

Figure 1:
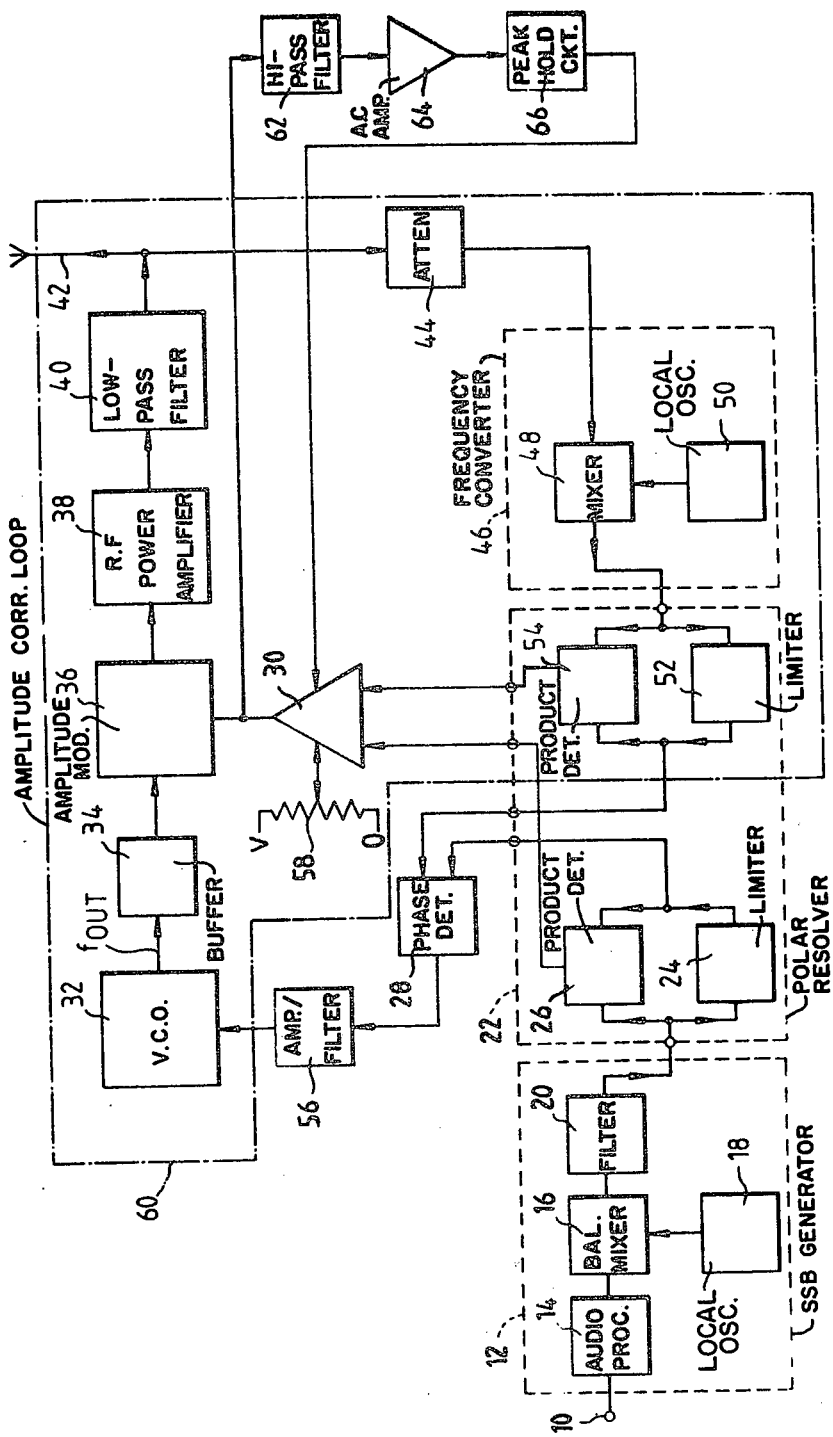
FIG. 1 is a block schematic circuit diagram of an embodiment of the present invention.

The embodiment shown in FIG. 1 comprises an input 10 for an audio frequency signal in the frequency range 300 Hz to 3.3 kHz. The signal is passed to a single sideband generator 12 which in the drawing comprises an audio processor 14 whose output is connected to one input of a balanced mixer 16 which has a second input for an output from a local oscillator 18. The local oscillator 18 is constructed to produce the purest possible signal output at say 10.7 MHz. The output from the balanced mixer 16 is applied to a sideband filter 20 which selects either the upper or lower sideband and rejects the other(s).

A polar resolver 22 is connected to an output of the sideband filter 20 for resolving the selected sideband signal into polar components. The polar resolver 22 comprises a first limiter 24, which removes the amplitude variations from the signal but preserves the phase information, and a first product detector 26, which produces a signal which corresponds to the envelope of the SSB signal, that is, the amplitude information. The phase information is applied to one input of a phase sensitive detector 28 and the amplitude information is applied to one input of a differential amplifier 30 which is implemented as an operational amplifier.

A voltage controlled oscillator 32 generates a signal at the transmitter frequency, $f_{out}$, which signal is applied via a buffer 34 to one input of an amplitude modulator 36 whose output is applied to a class B or class C R. F. power amplifier 38. The output from the power amplifier 38 is applied to an output load in the form of an antenna 42 via a low-pass filter 40.

In order to reduce any errors of phase and amplitude in the signal being copied, a feedback loop is provided. This loop comprises an attenuator 44 for deriving a portion of the output signal. A frequency converter 46 is connected to the output of the attenuator 44. The converter 46 comprises a mixer 48 which receives a frequency ($f_{out}$ − 10.7 MHz) from a synthesized local oscillator 50. The output from the mixer 48, which output comprises a frequency translated reproduction of the transmitter output signal, is applied to a second limiter 52 and a second product detector 54 of the polar resolver 22. The phase information from the second limiter 52 is applied as a second input to the phase sensitive detector 28. Any phase differences detected are amplified and filtered in an amplifier and filter 56 and the output therefrom is applied as a correction signal to the voltage controlled oscillator 32. The amplitude information from the second product detector 54 is applied as a second input to the differential amplifier 30. The difference between the two amplitude information signals is applied as a control input voltage to the amplitude modulator 36.

In order for the transmitter to be able to follow the low level input signal when it goes to zero, the amplitude modulator 36 must be capable of reducing the transmitter output level to say of the order of −70 dB with repect to peak enevelope power. By following the modulator 36 with the class B or class C amplifier 38 then this performance can be achieved. Such an amplifier 38 has an input threshold level below which the output level is greatly attenuated. In consequence, the amplitude modulator 36 need only reduce the output level to perhaps −20 dB in such a system.

Figure 2:
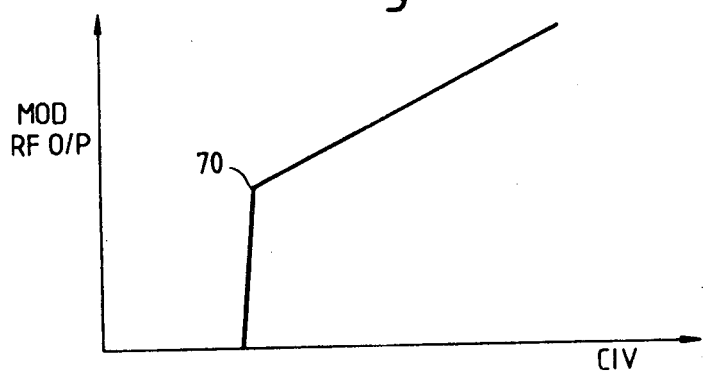
FIG. 2 is a graph of control input voltage (CIV) plotted against modulator R. F. output voltage (MOD R. F. o/p)

FIG. 2 illustrates a graph of control input voltage (CIV) plotted against modulated R. F. output level for a composite modulator formed by the modulator 36 and the R. F. power amplifier 38. The graph exhibits an abrupt discontinuity or a sharp knee 70 which illustrates that the setting of the D. C. component in the control input voltage is critical with respect to the knee 70. The D. C. component is set using a potentiometer 58.

Figure 3:
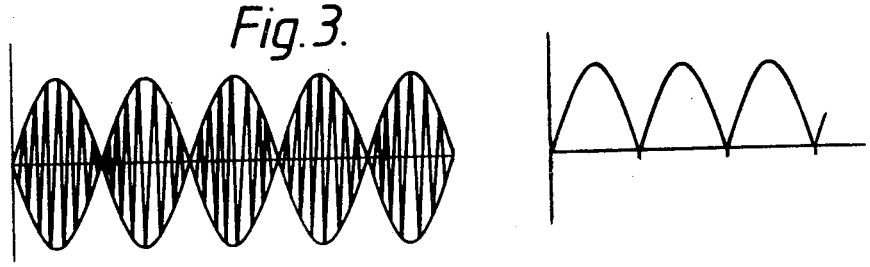
FIGS. 3, 4 and 5 show waveforms illustrating respectively a two-tone input SSB signal and the effects of too low and too high D. C. control input voltages on the SSB signal (FIG. 3) being copied.
Figure 4:
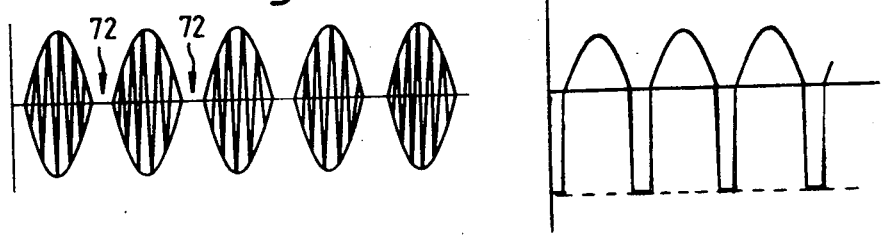
Figure 5:
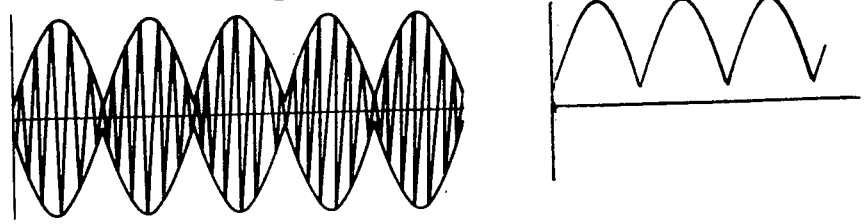

FIG. 3 shows a typical two tone signal SSB waveform which is to be copied. If the waveform has been copied correctly then the output waveform would be an amplified version of the input one. However, if the D. C. bias component of the control input voltage to the amplitude modulator 36 is too low, then, as shown in FIG. 4, the amplified signal goes to zero too soon so that gaps 72 appear between the envelopes at zero R. F. output level. FIG. 5 shows in contrast the effect of the D. C. bias component of the control input voltage being too high, with the result that the modulated R. F. output voltage cannot reach zero for a zero level in the input SSB waveform to be copied. Thus slight errors in this D. C. component of the control input voltage will produce a considerable increase in spurious output signals from the transmitter. It has been proposed to set the D. C. component using a precision manual setting of the potentiometer 58.

In the transmitter in accordance with the present invention it is possible to set and hold automatically the D. C. bias component in the control input voltage at its optimum value throughout the life of the equipment.

In FIG. 1 the amplitude correction loop 60 proper is enclosed within the block outlined by dots and dashes. The amplitude correction loop 60 has a low voltage gain of the order of one when there is negative feedback but below the abrupt discontinuity or knee 70 (FIG. 2) the amplitude modulator has a high gain, for example $\times 10^5$.

The potentiometer 58 is accurately adjusted so that the D. C. component in the differential amplifier 30 output corresponds closely to the knee 70 (FIG. 2) thus enabling the amplitude correction loop 60 to reduce the R. F. output envelope significantly (for example −70 dB with respect to peak envelope power) at zero crossings of the input waveform shown in FIG. 3.

If the D. C. bias set by the potentiometer 58 is slightly too low such that negative input peaks take the output below the knee 70, then the negative feedback loop around the differential amplifier 30 will be broken and the output voltage will fall rapidly with the result that negative going spikes will be produced due to the full open loop gain of the differential amplifier 30. As the slope of input to output of the amplitude correction loop 60 has a finite but very steep slope below the knee (FIG. 2), the amplitude of the spikes will change significantly with slight adjustment of the potentiometer 58.

The presence of these negative peaks can be used to provide an automatic D. C. bias control for the differential amplifier 30.

In FIG. 1 a bias control network comprises a high-pass filter 62, and A. C. amplifier 64 and a peak level hold circuit 66, connected between an output of the differential amplifier 30 and a bias control input of the amplifier 30. In use, the value of negative spikes is held by the circuit 66, this value being applied as negative feedback to the differential amplifier 30. In consequence the adjustment of the potentiometer 58 will be non-critical although the closer it is set to the optimum bias setting the more rapid will be the final adjustment. However if the potentiometer is set too high, the negative feedback bias adjusting system can only correct in one direction. Because the setting of the potentiometer 58 is non-critical, it could be implemented as a fixed bias network which is set at a value lower than the required optimum value. Overall the function of the bias control network is to generate a correct bias for the differential amplifier 30 such that negative spikes are only just occurring at its output when the input envelope (FIG. 3) goes through zero.

The effectiveness of the negative feedback bias-adjusting system is dependent on the loop gain. By providing the A. C. amplifier 64, it will amplify the negative spikes but not the peak held D. C. voltage. Additionally unlike a D. C. amplifier, which may exhibit D.C. drift with variations in temperature, an A.C. amplifier will not introduce such D.C. drifts.

A further requirement of the negative feedback bias-adjusting system is that it must only adjust the bias when there are zero crossings in the input waveform (FIG. 3). If zero crossings do not occur, for example because there is a constant amplitude envelope due to the input signal being a single tone audio modulation or a pilot carrier and no modulation, the bias must be maintained at a preset level and the negative feedback bias-adjusting system inhibited.

Figure 6:
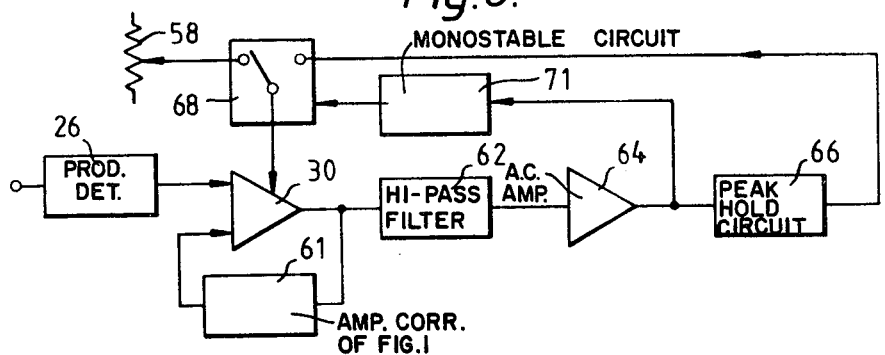
FIG. 6 is a block schematic circuit diagram of a part of the transmitter shown in FIG. 1 illustrating one arrangement for inhibiting the bias adjusting system in the event of there not being any zero crossings.

A first circuit arrangement for inhibiting the negative feedback bias-adjusting system is shown in FIG. 6 of the accompanying drawings. In FIG. 6 all the components of the amplitude correction loop 60 apart from the differential amplifier 30 are constituted by the block referenced 61. The bias control input of the differential amplifier 30 is coupled to the movable contact of a 2-pole change-over switch 68. One pole of the switch 68 is coupled to a wiper of the potentiometer 58. The other pole of the change-over switch 68 is connected to the output of the peak level hold circuit 66. The change-over switch 68 is controlled by a monostable circuit 71.

In operation when zero crossings are not occurring, it is not necessary for the bias applied to the differential amplifier 30 to be adjusted precisely. As it is zero crossings which generate the spurious signals, their absence prevents this from happening. By means of the arrangement shown in FIG. 6, the change-over switch 68 can be operated automatically to switch between two states which, for the purposes of clarity of description, will be referred to as first and second states.

The first state exists when there are no zero crossings such as when switching the polar loop transmitter ON at the commencement of a transmission. While the first state exists, the negative feedback adjustment to the bias input will be inoperative and a fixed D.C. bias is applied to the differential amplifier 30 via the switch 68 so that, for instance a pilot carrier is radiated at the correct level.

The second state exists after a zero crossing in the input waveform from the first product detector 26 has occurred. During this state it is necessary to change-over the contact of the switch 68 so that the negative feedback bias adjustment will operate in a manner as described with reference to FIG. 1. The second state should be maintained for a predetermined period of time after a zero crossing of for example 100 mS, after which time, the arrangement should revert back to the first state. However, if one or more zero crossings occur within the predetermined period then the second state is maintained until the predetermined period (e.g. 100 mS) after the final zero crossing has elapsed.

Control of the change-over switch 68 can be effected electronically by means of the monostable circuit 71 operated by the negative spikes produced by the zero crossings, which negative spikes are present at the output of the amplifier 64.

Figure 7:
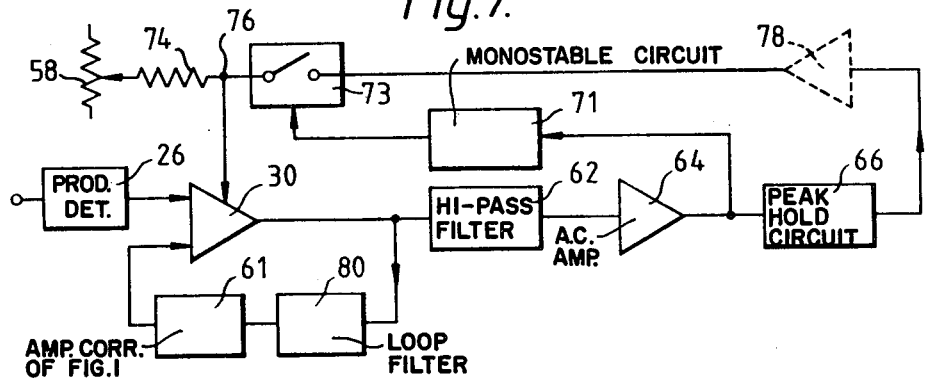
FIG. 7 is a block schematic circuit diagram of a part of the transmitter shown in FIG. 1 illustrating another arrangement for inhibiting the bias adjusting system in the event of there not being any zero crossings.

FIG. 7 shows an arrangement in which a single pole switch 73 is used instead of the 2-pole change-over switch 68 shown in FIG. 6. The switch 73 can conveniently comprise a CMOS switch which is connected in the negative feedback path and is controlled by the monostable circuit 71. A high value (1 MΩ) resistor 74 is connected between the wiper of the potentiometer 58 and a junction 76 in the feedback path at a point between the switch 73 and the bias control input of the amplifier 30. When the switch 73 is a CMOS switch then the output impedance of the peak level hold circuit 66 should be low. Alternatively the circuit 66 should be followed by a voltage follower 78 shown in broken lines.

In operation when there are no zero crossings in the input signal, then the switch 73 is non-conductive and a preset bias is applied to the amplifier 30 by way of the resistor 74. However, the switch 73 is rendered conductive by the monostable circuit 71 is response to a negative spike in the feedback path. The source impedance of the preset bias is determined by the value of the resistor 74 and as this is high, then the negative feedback bias voltage will not be modified by the preset bias.

In order to minimize problems due to noise, the loop bandwidth of the amplitude correction loop should not be greater than say 200 kHz. With this objective in mind, a loop filter 80 is included in the feedback path around the differential amplifier 30. The filter may take the form of a lead-lag low-pass filter. The arrangement including the loop filter 80 increases the amplitude of the fast transients which are detected by the peak level hold circuit 66. This effect can be enhanced by the differential amplifier 30 being implemented as a wide band operational amplifier such as a Signetics NE 531.

Figure 8:
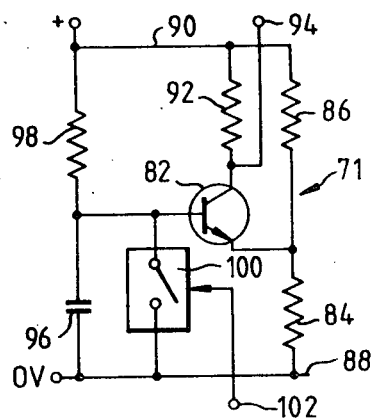
FIG. 8 is a schematic circuit diagram of a monostable circuit suitable for use in the arrangements shown in FIGS. 6 and 7.

FIG. 8 shows a monostable circuit 71 which is suitable for use in the arrangement shown in FIG. 7. The circuit 70 comprises an NPN transistor 82 whose emitter is held at a constant voltage by means of resistors 84, 86 connected in series between supply rails 88, 90. The collector of the transistor 82 is connected by a resistor 92 to the positive supply rail 90. An output 94 for the control of the CMOS switch 73 (FIG. 7) is derived from the collector. The base biasing circuit comprises a capacitor 96 coupled in series with a resistor 98 between the supply rails 88, 90 and a CMOS analog switch 100 connected in parallel with the capacitor 96. The CMOS switch 100 is rendered conductive by negative spikes applied to a terminal 102 by the amplifier 64 (FIG. 7). In the first state of the circuit, the capacitor 96 is charged and the transistor 82 is conductive so that the output 94 is low. However in the second state, the switch 100 is rendered conductive at the occurrence of a negative spike and the capacitor 96 is discharged causing the transistor 82 to become non-conductive and the output 94 to go high. The speed of switching of the output can be increased if the transistor 82 forms part of a Schmitt trigger circuit or comprises one of the input stages of a differential amplifier.

Figure 9:
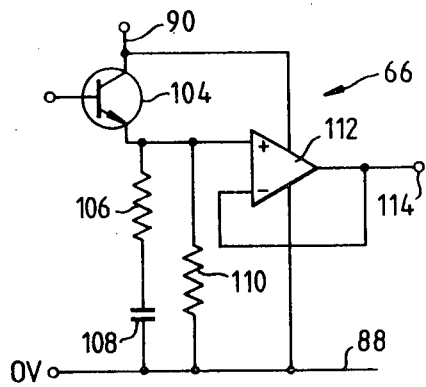
FIG. 9 is a schematic circuit diagram of a peak hold circuit.

FIG. 9 shows in greater detail an embodiment of a peak level hold circuit 66. The circuit 66 comprises an NPN transistor 104 connected as a voltage follower with its collector going to a positive supply rail 90, its base connected to receive the output from the amplifier 64 (FIGS. 1, 6 and 7) and its emitter connected by a resistor 106 and a capacitor 108 to the power supply rail 88. A resistor 110 is connected in parallel with the series combination of the resistor 106 and capacitor 108. The emitter is also connected to the non-inverting input of an operational amplifier 112, the output of which is supplied to an output terminal 114 and is fed back to the inverting input of the amplifier 112.

The peak level hold circuit operates as follows:

The capacitor 108 will charge rapidly to the input base voltage, less the transistor 104 $V_{be}$, in response to the negative peaks in the signal from the differential amplifier 30 (FIGS. 1, 6, 7). When the base voltage falls, the emitter-base junction of the transistor 104 will become reverse biased and the capacitor 108 will hold its charge. The voltage follower circuit minimizes the loading of the capacitor 108.

The main characteristics of the illustrated circuit are that it can increase the stored voltage rapidly but reductions cannot occur at a rate faster than the time constant $C_{108} \cdot R_{110}$ (capacitance of the capacitor 108 × resistance fo the resistor 110). The illustrated circuit enables the optimum bias voltage for the differential amplifier 30 (FIGS. 1, 6, 7) to be established rapidly within two or three zero crossings. The settling time of the circuit can be set by the resistance value of the resistor 106.

In implementing the polar loop transmitter circuit shown in FIG. 1, the mixer 16 comprises a high quality ring diode type ANZAC MD113, the polar resolver 22 is based on dual Plessey SL 624C multimode detector chips, the differential amplifier 30 is based on an NE 531 wideband operational amplifier, the amplitude modulator 36 comprises a Siliconix DV 1202W VMOS transistor and the power amplifier 38 is a BGY 36 amplifier operated in class B. The remainder of the circuit can be fabricated using techniques known in the polar loop transmitter art.

I claim:

1. A polar loop transmitter comprising in combination:
   (a) a source of carrier waves,
   (b) an amplitude modulator responsive to said carrier wave source for modulating an incoming signal onto a carrier wave to provide a transmitter output signal,
   (c) a differential amplifier for supplying said incoming signal to the amplitude modulator, said differential amplifier having a first input, a second input, an output coupled to said amplitude modulator and a bias control voltage input,
   (d) first means responsive to an input signal for providing a first signal related to the envelope of said input signal to said first input,
   (e) second means responsive to said output signal for providing a second signal related to the envelope of said output signal to said second input, and
   (f) a negative feedback bias adjusting system for said differential amplifier varying the bias control voltage thereof connected between the output and bias control voltage input of the differential amplifier.

2. A transmitter as claimed in claim 1, further comprising an R.F. power amplifier coupled to an output of the amplitude modulator, wherein a transfer characteristic of the incoming signal plotted against the modulated R.F. output from said power amplifier exhibits an abrupt discontinuity and wherein said negative feedback bias adjusting system adjusts the bias voltage so that for a zero level in the first signal, the incoming signal corresponds closely to said abrupt discontinuity.

3. A transmitter as claimed in claim 2, wherein said negative feedback bias adjusting system comprises means for supplying a predetermined bias voltage and means for supplying a variable bias voltage dependent upon negative peaks of said first signal taking the output of the differential amplifier below the abrupt discontinuity in said transfer characteristic.

4. A transmitter as claimed in claim 3, wherein said variable bias voltage supplying means comprises a peak level hold circuit for holding the value of negative spikes produced by the negative peaks of said first signal and applying the value held as the variable bias voltage.

5. A transmitter as claimed in claim 4, further comprising an A.C. amplifier to amplify the negative spikes to be applied to the peak level hold circuit.

6. A transmitter as claimed in claim 3, further comprising means for permitting the bias voltage to be adjusted only when zero crossings occur in the first signal.

7. A transmitter as claimed in claim 6, wherein said permitting means inhibits the connection of said variable bias voltage supplying means to said bias control input if the time duration between successive zero crossings exceeds a predetermined period of time.

8. A transmitter as claimed in claim 4, further comprising means for permitting the bias voltage to be adjusted only when zero crossings occur in the first signal.

9. A transmitter as claimed in claim 5, further comprising means for permitting the bias voltage to be adjusted only when zero crossings occur in the first signal.

10. A transmitter as claimed in claim 8, wherein said permitting means inhibits the connection of said variable bias voltage supplying means to said bias control input if the time duration between successive zero crossings exceeds a predetermined period of time.

11. A transmitter as claimed in claim 9, wherein said permitting means inhibits the connection of said variable bias voltage supplying means to said bias control input if the time duration between successive zero crossings exceeds a predetermined period of time.

* * * * *